US012795851B2

(12) United States Patent
Lee et al.

(10) Patent No.: US 12,795,851 B2
(45) Date of Patent: Nov. 10, 2026

(54) ELECTRONIC DEVICE INCLUDING HEAT DISSIPATION STRUCTURE

(71) Applicant: THINKWARE CORPORATION, Seongnam-si (KR)

(72) Inventors: Yong Lee, Seongnam-si (KR); Kihwan Kim, Seongnam-si (KR)

(73) Assignee: THINKWARE CORPORATION, Seongnam-si (KR)

( * ) Notice: Subject to any disclaimer, the term of this patent is extended or adjusted under 35 U.S.C. 154(b) by 178 days.

(21) Appl. No.: 18/435,102

(22) Filed: Feb. 7, 2024

(65) Prior Publication Data

US 2024/0276673 A1 Aug. 15, 2024

(30) Foreign Application Priority Data

Feb. 9, 2023 (KR) ........................ 10-2023-0017613

(51) Int. Cl.

*H05K 7/20* (2006.01)
*H05K 1/02* (2006.01)
*H05K 9/00* (2006.01)

(52) U.S. Cl.

CPC ....... *H05K 7/20127* (2013.01); *H05K 1/0203* (2013.01); *H05K 7/20145* (2013.01); *H05K 7/20163* (2013.01); *H05K 7/20436* (2013.01); *H05K 7/20972* (2013.01); *H05K 9/0024* (2013.01)

(58) Field of Classification Search

CPC ........... H05K 7/20127; H05K 7/20163; H05K 9/0024–0035

See application file for complete search history.

(56) References Cited

U.S. PATENT DOCUMENTS 7,385,821 B1 * 6/2008 Feierbach ........... H01L 23/4332 361/699
8,081,476 B2 * 12/2011 Tsao ..................... H05K 9/0032 257/713
9,877,380 B2 * 1/2018 Wanner ............. H05K 7/20454

(Continued)

FOREIGN PATENT DOCUMENTS

WO WO-2020144469 A1 * 7/2020 ............. H04N 23/52
WO WO-2022244494 A1 * 11/2022 ............. G03B 17/55

OTHER PUBLICATIONS

Extended European Search Reported dated Jun. 19, 2024, issued in counterpart European Patent Application No. 24156330.3 (9 pages).

*Primary Examiner* — Robert J Hoffberg
(74) *Attorney, Agent, or Firm* — WHDA, LLP

(57) ABSTRACT

An electronic device according to an embodiment comprises a housing including a front surface, a rear surface opposite to the front surface, and a plurality of side surfaces disposed between the front surface and the rear surface. The electronic device comprises a printed circuit board and a central processing unit disposed on the printed circuit board. The electronic device comprises a duct extending from a first side surface among the plurality of side surfaces, across an internal space of the housing, to a second side surface opposite to the first side surface. The electronic device comprises a heat sink at least partially protruding from an inner surface of the duct, for transmitting heat emitted from the central processing unit to the duct.

18 Claims, 10 Drawing Sheets

(56) References Cited

U.S. PATENT DOCUMENTS

| | | | | |
|---|---|---|---|---|
| 10,165,711 | B2 * | 12/2018 | Pallasmaa | H02M 7/003 |
| 10,477,739 | B2 * | 11/2019 | Dixon | H05K 1/0203 |
| D988,387 | S * | 6/2023 | Lee | D16/202 |
| D992,620 | S * | 7/2023 | Jang | D16/202 |
| 11,716,524 | B2 * | 8/2023 | Iwasaki | G03B 17/55 348/208.99 |
| D1,070,950 | S * | 4/2025 | Lee | D16/208 |
| 2024/0074030 | A1 * | 2/2024 | Tomimoto | H04N 23/53 |

* cited by examiner

ELECTRONIC DEVICE INCLUDING HEAT DISSIPATION STRUCTURE

CROSS-REFERENCE TO RELATED APPLICATION(S)

This application is based on and claims priority under 35 U.S.C. § 119 to Korean Patent Application No. 10-2023-0017613, filed on Feb. 9, 2023, in the Korean Intellectual Property Office, the disclosure of which is incorporated by reference herein in its entirety.

TECHNICAL FIELD

The disclosure relates to an electronic device including a heat dissipation structure.

BACKGROUND ART

The electronic device may provide a user with a variety of user experiences along with performing a designated function. When the electronic device performs such a designated function, at least some of internal components of the electronic device may generate heat. In order to emit heat generated inside the electronic device to an outside, the electronic device may have a heat dissipation structure.

SUMMARY

According to an embodiment, an electronic device may comprise a housing including a front surface, a rear surface opposite to the front surface, and a plurality of side surfaces disposed between the front surface and the rear surface. The electronic device may comprise a camera at least partially exposed through the front surface and a display forming at least a portion of the rear surface. The electronic device may comprise a printed circuit board (PCB) disposed in an internal space surrounded by the front surface, the rear surface, and the plurality of side surfaces of the housing, and including a first surface facing the front surface and a second surface opposite to the first surface and facing the rear surface. The electronic device may comprise a central processing unit (CPU) disposed on the second surface of the printed circuit board. The electronic device may comprise a duct disposed between the second surface of the printed circuit board and the display, and extending from a first side surface among the plurality of side surfaces, across the internal space of the housing, to a second side surface opposite to the first side surface. The electronic device may comprise a heat sink disposed on the CPU for transmitting heat emitted from the CPU to the duct, and at least partially protruding from an inner surface of the duct.

According to an embodiment, an electronic device may comprise a housing including a front surface, a rear surface opposite to the front surface, and a plurality of side surfaces disposed between the front surface and the rear surface. The electronic device may comprise a camera at least partially exposed through the front surface and a display forming at least a portion of the rear surface. The electronic device may comprise a printed circuit board (PCB) disposed in an internal space surrounded by the front surface, the rear surface, and the plurality of side surfaces of the housing, and including a first surface facing the front surface and a second surface opposite to the first surface and facing the rear surface. The electronic device may comprise a central processing unit (CPU) disposed on the second surface of the PCB. The electronic device may comprise a duct disposed between the second surface of the printed circuit board and the display, and extending from a first opening formed on a first side surface among the plurality of side surfaces, across the internal space of the housing, to a second opening formed on a second side surface opposite to the first side surface. The electronic device may comprise a slit disposed, toward the CPU, on an inner surface of the duct. The electronic device may comprise a heat sink disposed on the CPU for transmitting heat emitted from the CPU to the duct, and at least partially protruding from the inner surface of the duct, passing through the slit. The electronic device may comprise a shield can surrounding the CPU.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
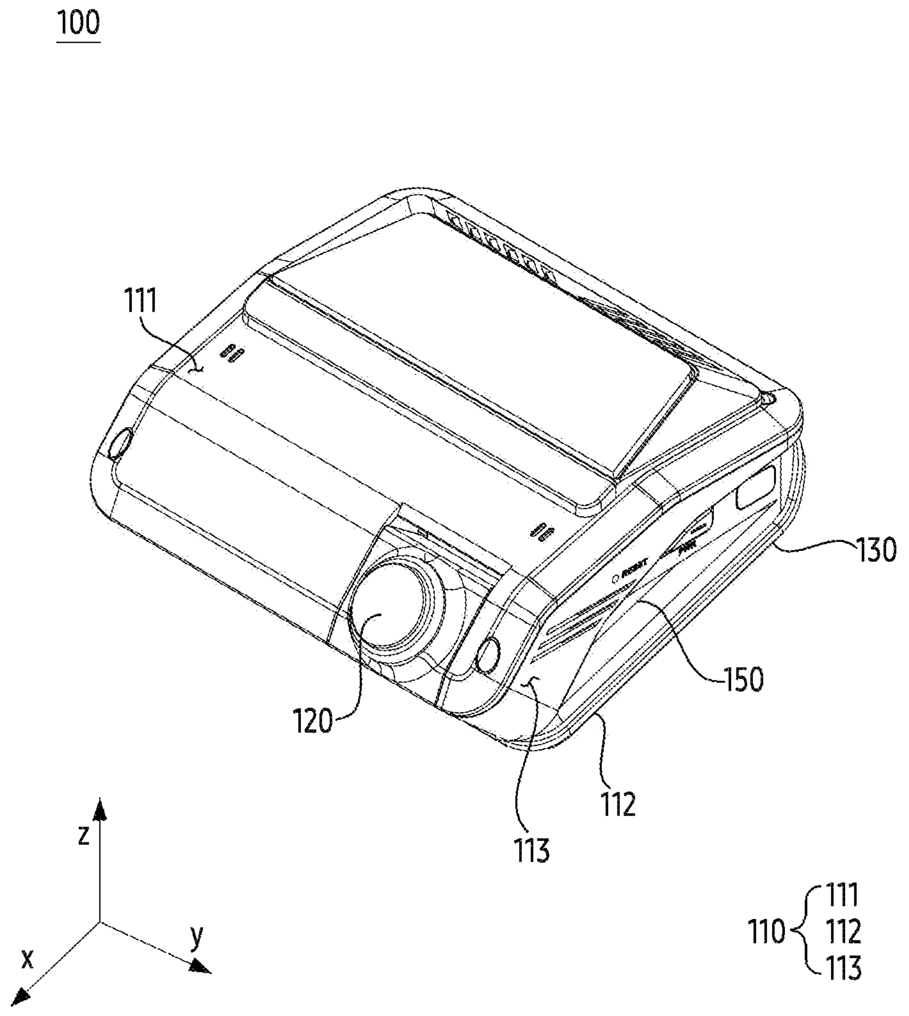
FIG. 1A is a perspective view of an example electronic device.
Figure 1B:
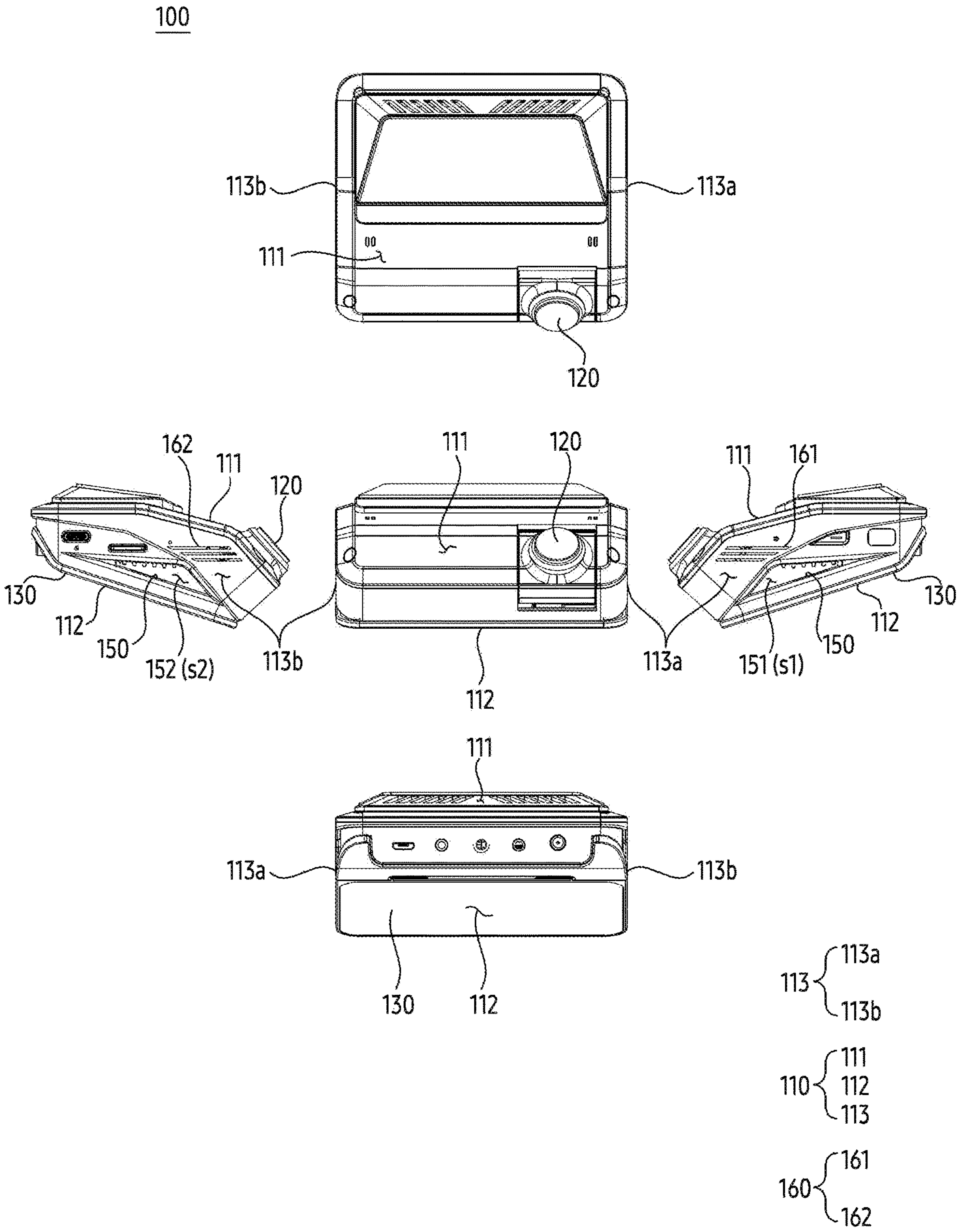
FIG. 1B shows each external appearance of an example electronic device.
Figure 1C:
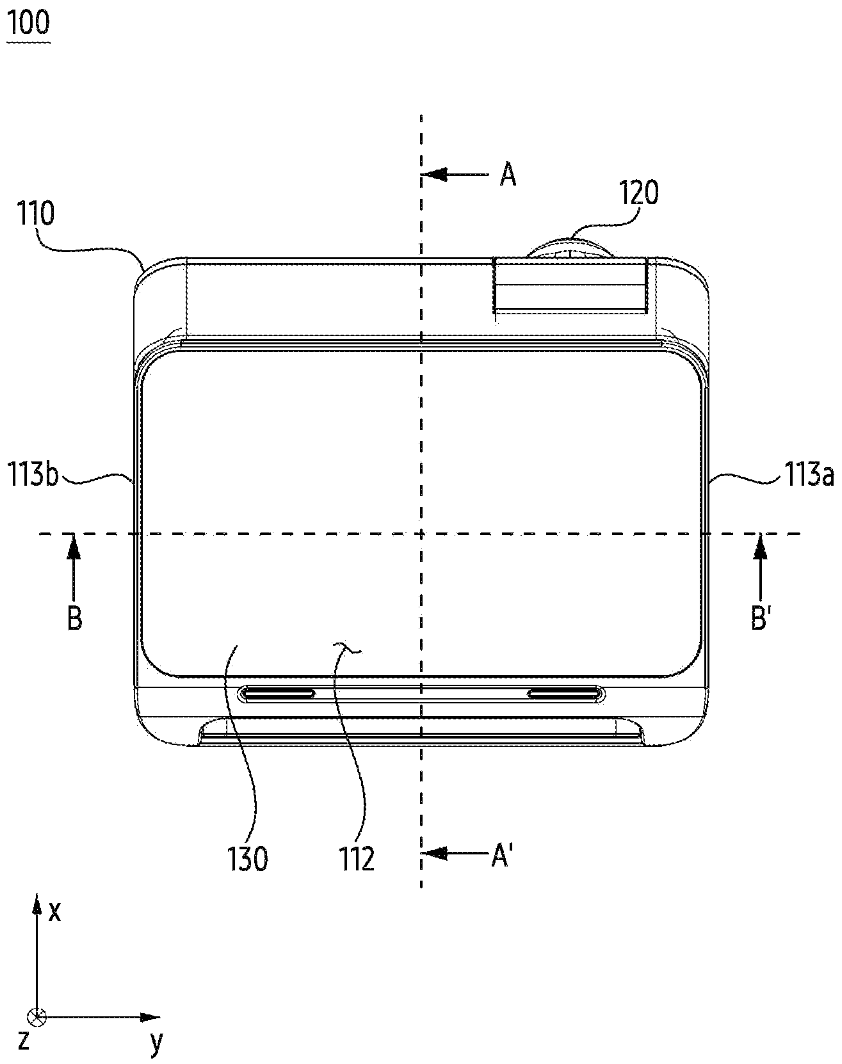
FIG. 1C is a rear view of an example electronic device.

FIG. 1A is a perspective view of an example electronic device. FIG. 1B illustrates each external appearance of an example electronic device. FIG. 1C is a rear view of an example electronic device.

Referring to FIGS. 1A, 1B, and 1C, the electronic device 100 may include a housing 110, a camera 120, a display 130, and a duct 150.

According to an embodiment, the electronic device 100 may be referred to as a "dashcam" disposed inside a vehicle. The electronic device 100 may capture a still image and/or a moving image related to an external environment of the vehicle. For example, although not illustrated herein, the electronic device 100 may be attached to a portion (e.g., a dash board) of the vehicle adjacent to a front wind shield in the vehicle. The electronic device 100 may be configured to obtain image information about a front direction environment of the vehicle through the camera 120, store the image information in a memory (not shown) in the electronic device 100, or output the image information as visual information through the display 130 based on the image information.

While it has been described that the electronic device 100 is attached to a position adjacent to a front glass in the vehicle, the position where the electronic device 100 is attached inside the vehicle is not limited thereto. For example, the electronic device 100 may be attached to a portion of the vehicle adjacent to its rear wind shield to obtain image information about a rear direction environment of the vehicle. However, the disclosure is not limited thereto, and the electronic device 100 may be disposed at any position capable of obtaining image information on the external environment of the vehicle.

According to an embodiment, the housing 110 may include a front surface 111, a rear surface 112 opposite to the front surface 111, and a plurality of side surfaces 113 disposed between the front surface 111 and the rear surface 112. For example, the housing 110 may form the exterior of the electronic device 100. The housing 110 may refer to a structure forming at least some of the front surface 111, the rear surface 112, and/or the plurality of side surfaces 113. For example, the rear surface 112 may face away from the front surface 111. The plurality of side surfaces 113 may surround a space between the front surface 111 and the rear surface 112. For example, each of the plurality of side surfaces 113 may extend from the front surface 111 to the rear surface 112.

According to an embodiment, the housing 110 may be provided with an inner space surrounded by the front surface 111, the rear surface 112 opposite to the front surface 111, and the plurality of side surfaces 113 disposed between the front surface 111 and the rear surface 112, for at least one component (e.g., a printed circuit board 210 of FIG. 2A) included in the electronic device 100.

According to an embodiment, the front surface 111 of the housing 110 may include a plurality of planar surfaces and a plurality of curved surfaces connecting the plurality of planar surfaces. According to an embodiment, the rear surface 112 of the housing 110 may have a planar shape. According to an embodiment, at least some of the plurality of side surfaces 113 of the housing 110 may have a step. However, the disclosure is not limited thereto.

According to an embodiment, the plurality of side surfaces 113 of the housing 110 may include a first side surface 113*a* and a second side surface opposite to the first side surface 113*a*. For example, the first side surface 113*a* may be spaced apart from the second side surface 113*b*. For example, the first side surface 113*a* may face the second side surface 113*b*. For example, the first side surface 113*a* may face away from the second side surface 113*b*.

According to an embodiment, at least a portion of the camera 120 may be exposed through the front surface 111 of the housing 110. For example, the front surface 111 of the housing 110 may include a camera hole for the camera 120. A portion of the camera 120 may be electrically connected to at least one component (e.g., the printed circuit board 210 of FIG. 2A) disposed in the inner space of the housing 110. The remaining portion including the lens of the camera 120 may be exposed to the outside of the electronic device 100 through the camera hole. According to an embodiment, at least a portion of the camera 120 may protrude from the front surface 111. According to an embodiment, at least a portion of the camera 120 may be exposed to the outside through the front surface 111 and/or at least a portion of the plurality of side surfaces 113 extending from the front surface 111. According to an embodiment, the camera 120 may be configured to be rotatable.

According to an embodiment, the display 130 may form at least a portion of the rear surface 112 of the housing 110. For example, at least a portion of the display 130 may be exposed through the rear surface 112 of the housing 110. For example, the display 130 may include a portion of the rear surface 112 protruding toward the outside of the housing 110. For example, the rear surface 112 of the housing 110 may include a display area in which visual information of the display 130 is displayed. For example, the display 130 may be spaced apart from the camera 120 at least partially exposed through the front surface 111. For example, the display 130 may be electrically connected to a flexible printed circuit board (not shown) disposed, underneath the rear surface 112, in the inner space of the housing 110.

According to an embodiment, a duct 150 may extend from the first side surface 113*a* of the plurality of side surfaces 113 of the housing 110, across the inner space of the housing 110, to the second side surface 113*b* opposite to the first side surface 113*a*.

For example, the duct 150 may pass through the inner space of the housing 110. For example, the duct 150 may be disposed between the front surface 111 of the housing 110 and the rear surface 112 opposite to the front surface 111.

For example, the inner surface of the duct 150 may extend from the first side surface 113*a* to the second side surface 113*b* opposite to the first side surface 113*a*. For example, the inner surface of the duct 150 may connect the first side surface 113*a* and the second side surface 113*b* to each other.

According to an embodiment, the duct 150 may be configured to dissipate heat generated within the electronic device 100 to the outside of the electronic device 100, by passing air through it. For example, as the electronic device 100 operates, heat may be generated from at least one component (e.g., the printed circuit board 210 and/or a central processing unit 220 of FIG. 2A) within the electronic device 100. The heat generated from the at least one component may be transferred to an inside of the duct 150 through the inner surface of the duct 150. The duct 150 may be configured to transmit the heat transferred into the duct 150 to air passing through the duct 150. The duct 150 may dissipate the heat transferred into the duct 150 to the outside of the electronic device 100, by means of a convection heat transfer of air passing through the duct 150. The dissipation of heat from the at least one electronic component through the inner surface of the duct 150 to the inside of the duct 150 will be described later with reference to FIGS. 2A and 2B.

According to an embodiment, the duct 150 may include a first opening 151 formed in the first side surface 113*a* and a second opening 152 formed in the second side surface 113*b* opposite to the first side surface 113*a*. An area size s1 of the first opening 151 and an area size s2 of the second opening 152 may be in a range of 1 $mm^2$ to 81 $mm^2$, respectively.

For example, the duct 150 may extend from the first opening 151 formed on the first side surface 113*a* among the plurality of side surfaces 113, across the inner space of the housing 110, to the second opening 152 formed on the second side surface 113*b* opposite to the first side surface 113*a*.

For example, the heat transferred from the inner space of the housing 110 to the inside of the duct 150 through the first opening 151 and/or the second opening 152 may be discharged to the outside of the electronic device 100. For example, air may be introduced or discharged through the first opening 151 and/or the second opening 152, for dissipating the heat emitted from the inner space of the electronic device 100.

For example, a width of the first opening 151 and a width of the second opening 152 may be in a range of 1 mm to 9 mm, respectively. For example, a length of the first opening 151 and a length of the second opening 152 may be in a range of 1 mm to 35 mm, respectively. For example, a length of a short axis of a cross section of the duct 150 taken based on an x-z plane may be in a range of 1 mm to 9 mm. For example, a length of a long axis of the cross section of the duct 150 taken based on the x-z plane may be in a range of 1 mm to 35 mm.

For example, a sectional area of the duct 150 taken based on the x-z plane may have a constant shape. The first opening 151 and the second opening 152 may have the shape of the above-described cross section. As the size s1 of the first opening 151, the size s2 of the second opening 152, and the size of the cross section of the duct 150 are all in a range of 1 $mm^2$ to 81 $mm^2$, respectively, the electronic device 100 may prevent or alleviate unintended insertion of any body part (e.g., a finger) of a user of the electronic device 100 into the duct 150, through the first opening 151 and/or the second opening 152.

According to an embodiment, the housing 110 may further include a plurality of vent holes 160. The housing 110 may further include a first vent hole 161 formed in the first side surface 113*a* and a second vent hole 162 formed in the second side surface 113*b* opposite to the first side surface 113*a*.

For example, the plurality of vent holes 160 may be connected into the inner space of the housing 110 from at least one of the front surface 111, the rear surface 112, and/or the plurality of side surfaces 113 of the housing 110. For example, the first vent hole 161 may be connected from the first side surface 113*a* to the inner space of the housing 110. For example, the second vent hole 162 may be connected from the second side surface 113*b* to the inner space of the housing 110. For example, the first vent hole 161 may be spaced apart from the first opening 151, and the second vent hole 162 may be spaced apart from the second opening 152. The electronic device 100 may be configured to discharge the heat generated from the inner space of the housing 110 to the outside of the electronic device 100, through the plurality of vent holes 160, together with the duct 150.

According to the above-described embodiment, the electronic device 100 may include the duct 150 across the inner space of the housing 110, thereby discharging the heat generated from the inner space to the outside of the electronic device 100. The duct 150 may dissipate the heat generated from the inner space of the housing 110 to the outside of the electronic device 100 through air introduced or discharged through the first opening 151 and/or the second opening 152. The electronic device 100 may be configured to discharge the heat generated from the inner space of the housing 110 to the outside, through the plurality of vent holes 160 formed in the housing 110, together with the duct 150. The electronic device 100 may discharge the heat generated from the inner space of the housing 110 to the outside of the electronic device 100 through the duct 150 and the plurality of vent holes 160, thereby alleviating possible damage to the electronic components contained in the electronic device 100 due to the heat.

Figure 2A:
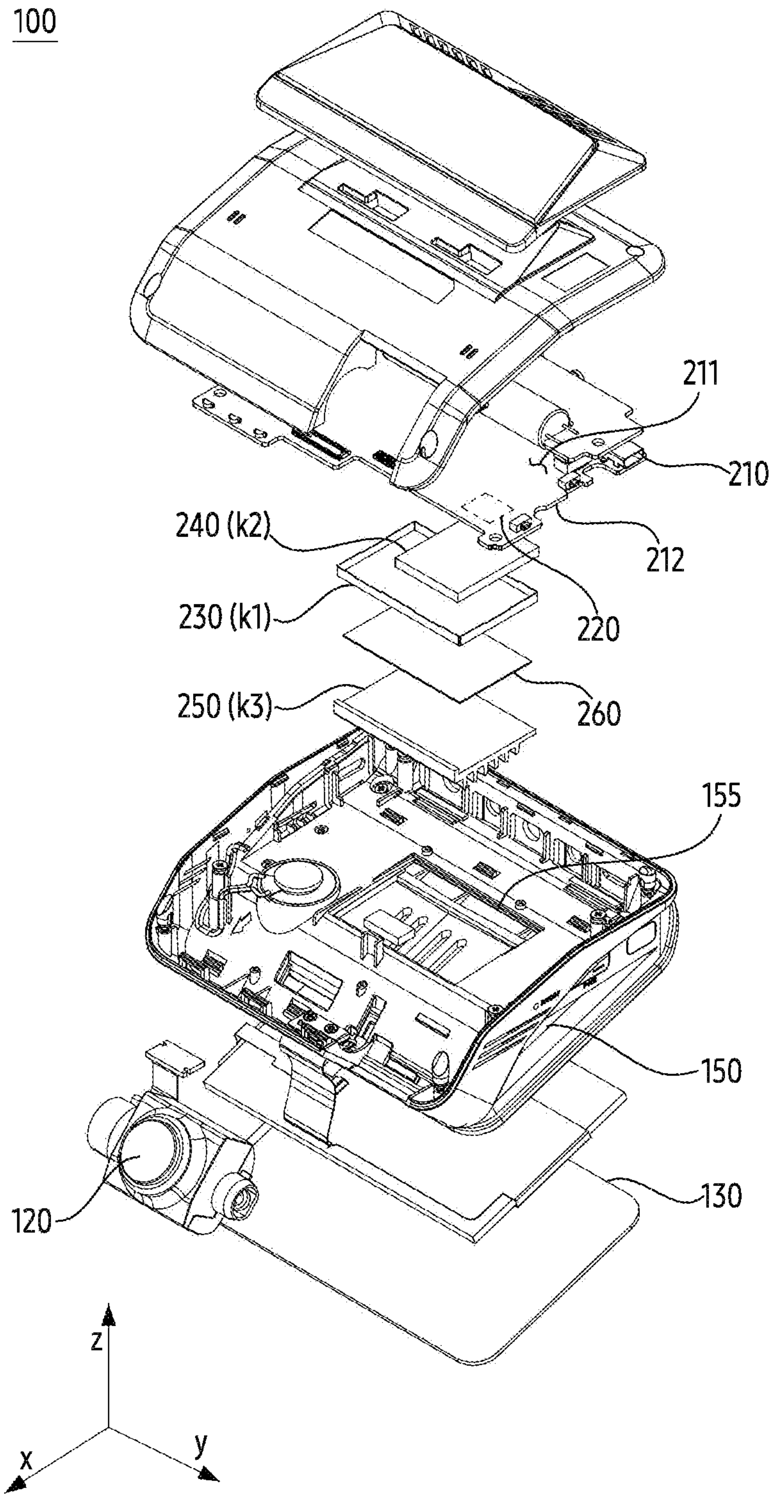
FIG. 2A is an exploded perspective view of an example electronic device.
Figure 2B:
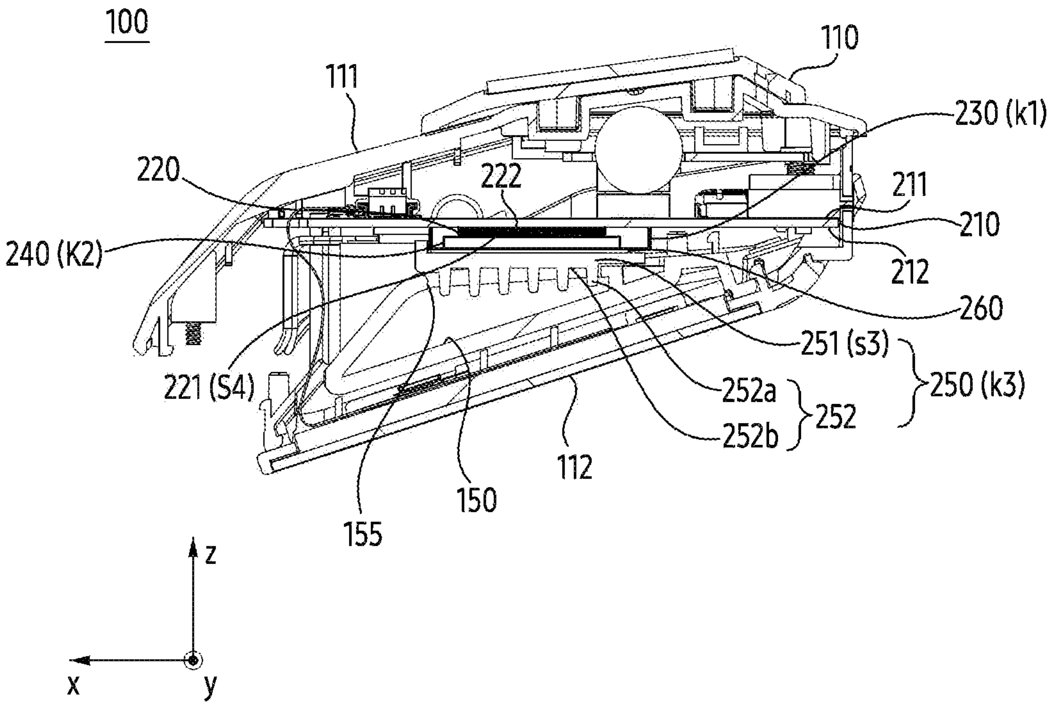
FIG. 2B is a cross-sectional view of an example electronic device taken along A-A' of FIG. 1C.

FIG. 2A is an exploded perspective view of an example electronic device. FIG. 2B is a cross-sectional view of an example electronic device taken along line A-A' of FIG. 1C.

Referring to FIGS. 2A and 2B, an electronic device 100 may include a housing 110, a camera 120, a display 130, a duct 150, a printed circuit board 210, a central processing unit 220, and a heat sink 250.

Hereinafter, any redundant descriptions of components having the same or like reference numerals as those described above with reference to FIGS. 1A to 1C will be omitted for conciseness and brevity.

According to an embodiment, a processor, a memory, and/or an interface may be mounted on the printed circuit board 210. The processor may include, for example, one or more of a central processing unit, an application processor, a graphic processing unit, an image signal processor, a sensor hub processor, or a communication processor. The memory may include, for example, a volatile memory or a non-volatile memory. The interface may include, for example, a high definition multimedia interface (HDMI), a universal serial bus (USB) interface, a secure digital (SD) card interface, and/or an audio interface. The interface may electrically or physically connect the electronic device 100 to an external electronic device and may include a USB connector, an SD card/MMC connector, or an audio connector.

According to an embodiment, the printed circuit board 210 may be disposed in the inner space surrounded by the front surface 111, the rear surface 112, and the plurality of side surfaces 113 of the housing 110. The printed circuit board 210 may include a first surface 211 facing the front surface 111, and a second surface 212 opposite to the first surface 211 and facing the rear surface 112.

For example, the printed circuit board 210 may be fixedly disposed in the inner space of the housing 110 by means of a coupling member such as, e.g., a screw. For example, since the area of the second surface 212 of the printed circuit board 210 facing a slit 155 is larger than the area of the slit 155, the printed circuit board 210 may be disposed in the inner space of the housing 110 without passing through the slit 155. However, the disclosure is not limited to the above-described example.

For example, the first surface 211 of the printed circuit board 210 may be electrically connected to the camera 120 via a connection member (e.g., a connector). For example, the second surface 212 of the printed circuit board 210 may face the display 130.

While it has been described that the electronic device 100 includes the printed circuit board 210, but the disclosure not limited thereto. The electronic device 100 may include a plurality of printed circuit boards. The plurality of printed circuit boards may be electrically connected to each other via at least one flexible printed circuit board.

According to an embodiment, the duct 150 may be disposed between the second surface 212 of the printed circuit board 210 and the display 130. For example, the duct 150 may be disposed between the printed circuit board 210 and the display 130. For example, the duct 150 may be disposed between the second surface 212 of the printed circuit board 210 and the rear surface 112 of the housing 110. For example, the duct 150 may include an air gap between the printed circuit board 210 and the display 130. For example, the duct 150 may extend from a first side surface (e.g., the first side surface 113*a* of FIG. 1B) of the housing 110, across a space between the printed circuit board 210 and the display 130, to a second side surface (e.g., the second side surface 113*b* of FIG. 1B) opposite to the first side surface 113*a*. As the electronic device 100 includes the duct 150 between the printed circuit board 210 and the display 130, the electronic device 100 may reduce or alleviate possible damage to the display 130 owing to heat generated from the printed circuit board 210 and/or any component (e.g., the central processing unit 220) mounted on the printed circuit board.

According to an embodiment, the central processing unit 220 may be disposed on the second surface 212 of the printed circuit board 210, facing the rear surface 112 of the housing 110 on which the display 130 is disposed. It is to be noted that throughout the disclosure, when an element is referred to as being "on" another element, it may mean that the element may be directly on the other element or that there may be intervening elements therebetween, so it is not intended to limit the arrangement relationship between the two elements thereto. For example, throughout the disclosure, "B disposed on A" may indicate "B disposed over A". For example, throughout the disclosure, "B disposed on A" may indicate "B disposed under A". For example, throughout the disclosure, “B disposed on A” may indicate “B facing away A”. For example, “the central processing unit 220 disposed on the second surface 212” may refer to “the central processing unit 220 disposed over the second surface 212 with respect to the −z direction”. For example, “the central processing unit 220 disposed on the second surface 212” may refer to “the central processing unit 220 disposed under the second surface 212 with respect to the +z direction”. For example, “the central processing unit 220 disposed on the second surface 212” may refer to “the central processing unit 220 in contact with the second surface 212”. For example, “the central processing unit 220 disposed on the second surface 212” may refer to “the central processing unit 220 facing away from the second surface 212”. As the central processing unit 220 and/or a heat dissipation structure of the central processing unit 220, which will be described later, are disposed on the second surface 212, the electronic device 100 may be configured to provide an additional space within the housing 110 between the first surface 211 of the printed circuit board 210 and the front surface 111 of the housing 110.

For example, the central processing unit 220 may be coupled to the second surface 212 of the printed circuit board 210. For example, the central processing unit 220 may face the display 130. For example, the central processing unit 220 may face the duct 150. For example, the central processing unit 220 may dissipate heat toward the duct 150 while the electronic device 100 operates. Since the duct 150 is disposed between the central processing unit 220 and the display 130, the duct 150 may dissipate the heat generated from the central processing unit 220 to the outside of the electronic device 100, thereby reducing damage to the display 130 due to the heat.

While the duct 150 has been described as dissipating the heat emitted from the central processing unit 220 to the outside of the electronic device 100, the disclosure is not limited thereto. The electronic device 100 may include at least one heating element that generates heat when the electronic device 100 is in operation, including the central processing unit 220. The at least one heating element may include a processor (e.g., an image signal processor), a memory, a graphic processing unit, and/or an interface in the electronic device 100, but the disclosure is not limited thereto. The duct 150 may be configured to dissipate the heat generated from at least one heating element in the electronic device 100 to the outside of the electronic device 100, thereby reducing possible damage to the at least one heating element in the electronic device 100 and electronic components around the at least one heating element.

According to an embodiment, the electronic device 100 may further include a slit 155 disposed on an inner surface of the duct 150 toward the central processing unit 220 and configured to pass through the heat sink 250. The slit 155 may be disposed on an inner surface of the duct 150 toward the central processing unit 220. For example, the slit 155 may be formed in a portion of the inner surface of the duct 150, facing the second surface 212 of the printed circuit board 210. For example, the slit 155 may be connected from the inner surface of the duct 150 to an inner space of the housing 110 in which the printed circuit board 210 is disposed. For example, when the printed circuit board 210 is viewed from above with respect to the z-axis, the slit 155 may overlap the central processing unit 220. For example, the slit 155 may be a passage through which heat emitted from the printed circuit board 210 and/or the central processing unit 220 is transferred to the duct 150. As the electronic device 100 includes the slit 155 disposed on the inner surface of the duct 150 toward the central processing unit 220, the electronic device 100 may be configured to dissipate the heat generated from the central processing unit 220 into the duct 150 through the slit 155.

According to an embodiment, the central processing unit 220 may include a third surface 221 facing the duct 150 and a fourth surface 222 opposite to the third surface 221. The third surface 221 may face the slit 155 disposed on the inner surface of the duct 150. For example, the third surface 221 of the central processing unit 220 may face the duct 150. The third surface 221 may face the rear surface 112 of the housing 110. For example, the fourth surface 222 of the central processing unit 220 may be electrically connected to the second surface 212 of the printed circuit board 210. The fourth surface 222 may face the front surface 111 of the housing 110. For example, the heat generated from the central processing unit 220 may be transferred from the fourth surface 222 through the third surface 221 toward the slit 155.

According to an embodiment, the heat sink 250 may be disposed on the central processing unit 220 to transfer the heat emitted from the central processing unit 220 to the duct 150, at least a portion of the heat sink 250 protruding from the inner surface of the duct 150 through the slit 155.

For example, the heat sink 250 may be disposed between the central processing unit 220 and the duct 150. For example, a portion of the heat sink 250 may be disposed in the inner space of the housing 110 toward the central processing unit 220, and the remaining portion of the heat sink 250 may protrude from the portion of the heat sink 250 through the slit 155 into the duct 150. For example, the heat sink 250 may be disposed on a heat transfer path through which the heat generated from the central processing unit 220 is discharged toward the duct 150. For example, at least a portion of the heat sink 250 may be exposed to the outside when the first opening (e.g., the first opening 151 of FIG. 1B) and/or the second opening (e.g., the second opening 152 of FIG. 1B) of the duct 150 are viewed from above with respect to the y-axis. The heat transferred from the central processing unit 220 to the heat sink 250 may be discharged to the outside of the electronic device 100 by convection of air introduced into or discharged from the duct 150 through the first opening 151 and/or the second opening 152. Since at least a portion of the heat sink 250 protrudes from the inner surface of the duct 150 through the slit 155, the heat sink 250 may be configured to transfer the heat transferred from the central processing unit 220 to the heat sink 250, toward the inside of the duct 150.

According to an embodiment, the electronic device 100 may further include a shield can 230 surrounding the central processing unit 220, and a heat dissipation member 240 in contact with the third surface 221 facing the duct 150 of the central processing unit 220 in the shield can 230.

For example, the shield can 230 may be disposed on the second surface 212 of the printed circuit board 210. The shield can 230 may be configured to seal a space in which the central processing unit 220 is disposed. For example, the shield can 230 may be soldered onto the second surface 212. For example, the shield can 230 may cover the central processing unit 220. For example, the shield can 230 may be disposed between the second surface 212 and the heat sink 250. By surrounding the central processing unit 220, the shield can 230 may reduce diffusion of heat emitted from the central processing unit 220 to the surroundings of the central processing unit 220 within the inner space of the housing 110. The shield can 230 may be configured to surround the central processing unit 220 to transfer the heat emitted from the central processing unit 220 to the heat sink 250.

For example, the heat dissipation member 240 may be attached to the third surface 221 of the central processing unit 220 and the shield can 230, in the shield can 230. The heat emitted from the central processing unit 220 may be conducted to the shield can 230 through the heat dissipation member 240. The electronic device 100 may further include the shield can 230 and the heat dissipation member 240, such that the heat emitted from the central processing unit 220 is conducted to the heat dissipation plate 250.

According to an embodiment, the thermal conductivity k1 of the shield can 230 may be greater than the thermal conductivity k2 of the heat dissipation member 240 and less than the thermal conductivity k3 of the heat dissipation plate 250. Since the thermal conductivity k1 of the shield can 230 is greater than the thermal conductivity k2 of the heat dissipation member 240, the heat emitted from the central processing unit 220 may be conducted to the shield can 230 through the heat dissipation member 240 in contact with the third surface 221 of the central processing unit 220. The thermal conductivity k1 of the shield can 230 is less than the thermal conductivity k3 of the heat sink 250, and thus, the heat conducted to the shield can 230 may be discharged into the duct 150 through the heat sink 250.

According to an embodiment, the electronic device 100 may further include an adhesive member 260 disposed between the shield can 230 and the heat sink 250. For example, the adhesive member 260 may be disposed on one surface of the shield can 230 facing the slit 155. For example, the adhesive member 260 may fasten the heat sink 250 onto the shield can 230. The adhesive member 260 may be disposed between the shield can 230 and the heat sink 250, thereby reducing the heat sink 250 from being separated from the shield can 230 and/or the slit 155. According to an embodiment, the adhesive member 260 may include at least one of a thermal tape and a thermal pad.

According to an embodiment, although not shown herein, the heat dissipation member 240 may be omitted. In this case, the shield can 230 may come into contact with the third surface 221 of the central processing unit 220. The heat emitted from the central processing unit 220 may be conducted to the heat sink 250 through the shield can 230.

According to an embodiment, the heat sink 250 may include a first portion 251 having a planar shape at a position adjacent to the central processing unit 220, and a second portion 252 penetrating the slit 155 from the first portion 251 and extending into the duct 150.

For example, the first portion 251 may be a portion of the heat sink 250 disposed in the inner space of the housing 110. For example, the first portion 251 may be a portion of the heat sink 250 that is in contact with the shield can 230. For example, the first portion 251 may be a portion of the heat sink 250 that is adjacent to the central processing unit 220. For example, the first portion 251 may cover a portion of the shield can 230. For example, the first portion 251 may be a portion that dissipates heat transferred from the central processing unit 220 to the shield can 230. For example, the first portion 251 may be supported by an edge of the slit 155. Since the area s3 of the first portion 251 is larger than the size of the slit 155, the first portion 251 may be disposed in the inner space of the housing 110 without passing through the slit 155. Heat emitted from the central processing unit 220 may be transferred to the first portion 251 owing to the conductive heat transfer by heat dissipation structures (e.g., the heat dissipation member 240, the shield can 230, and/or the adhesive member 260) disposed in the heat transfer path between the central processing unit 220 and the first portion 251.

For example, the second portion 252 may extend from the first portion 251 through the slit 155 toward the inside of the duct 150. For example, a portion of the second portion 252 may be disposed within the slit 155, and the remaining portion of the second portion 252 may protrude from the inner surface of the duct 150. For example, the second portion 252 may be a portion of the heat sink 250 that comes into contact with air introduced into the duct 150 through the first opening 151 and/or the second opening 152. The heat transferred from the central processing unit 220 to the first portion 251 may be then transferred to the air inside the duct 150 from the second portion 252 connected to the first portion 251 by means of the convection heat transfer. Since air in the duct 150 is introduced into the duct 150 through the first opening 151 and/or the second opening 152 or is discharged from the duct 150, the heat may be dissipated from the electronic device 100 to the outside.

According to an embodiment, the area s3 of the first portion 251 of the heat sink 250 facing the central processing unit 220 may be greater than the area s4 of the third surface 221 facing the duct 150 of the central processing unit 220. For example, when the heat sink 250 is viewed from above with respect to the z-axis, the third surface 221 of the central processing unit 220 may overlap the first portion 251 of the heat sink 250. For example, the first portion 251 of the heat sink 250 may cover the third surface 221 of the central processing unit 220. Since the area s3 of the first portion 251 is larger than the area s4 of the third surface 221, the heat transfer rate of heat transferred from the third surface 221 to the first portion 251 may increase.

According to an embodiment, the second portion 252 of the heat sink 250 may include a plurality of protrusions **252*a* and a plurality of grooves 252*b* disposed between the plurality of protrusions 252*a*. For example, each of the plurality of protrusions 252*a* may be spaced apart from each other. Each of the plurality of protrusions 252*a* may extend from the first portion 251 of the heat sink 250 through the slit 155 into the duct 150. For example, each of the plurality of grooves 252*b* may be formed by spacing each of the plurality of protrusions 252*a* apart from each other. The second portion 252 exposed to the inside of the duct 150 through the slit 155 may include the plurality of protrusions 252*a* and the plurality of grooves 252*b* disposed between the plurality of protrusions 252*a*, thereby increasing an area in contact with the air inside the duct 150. The second portion 252 may increase the area in contact with the air inside the duct 150 so as to increase the convection heat transfer rate from the heat sink 250 to the air inside the duct 150**.

The electronic device 100 according to the above-described embodiment may include the duct 150 disposed between the second surface 212 of the printed circuit board 210, on which the central processing unit 220 is disposed, and the display 130, thereby discharging the heat generated from the central processing unit 220 through the duct 150 to the outside of the electronic device 100 and reducing damage to the display 130 caused by the heat. The electronic device 100 may include the slit 155 disposed on the inner surface of the duct 150 toward the central processing unit 220, and the heat sink 250 passing through the slit and at least partially protruding from the inner surface of the duct 150, so as to discharge the heat generated from the central processing unit 220 through the heat sink 250 into the duct 150. The electronic device 100 may include the shield can 230 surrounding the central processing unit 220, and the heat dissipation member 240 in contact with the central processing unit 220 in the shield can 230, thereby reducing diffusion of the heat emitted from the central processing unit 220 around the central processing unit 220 and reducing damage to electronic components in the inner space of the housing 110 due to the heat. The heat sink 250 may include a plurality of protrusions 252*a* and a plurality of grooves 252*b* between the plurality of protrusions 252*a* for increasing a cross-sectional area contacting the air inside the duct 150, thereby increasing the heat transfer rate from the heat sink 250 to the air.

Figure 3A:
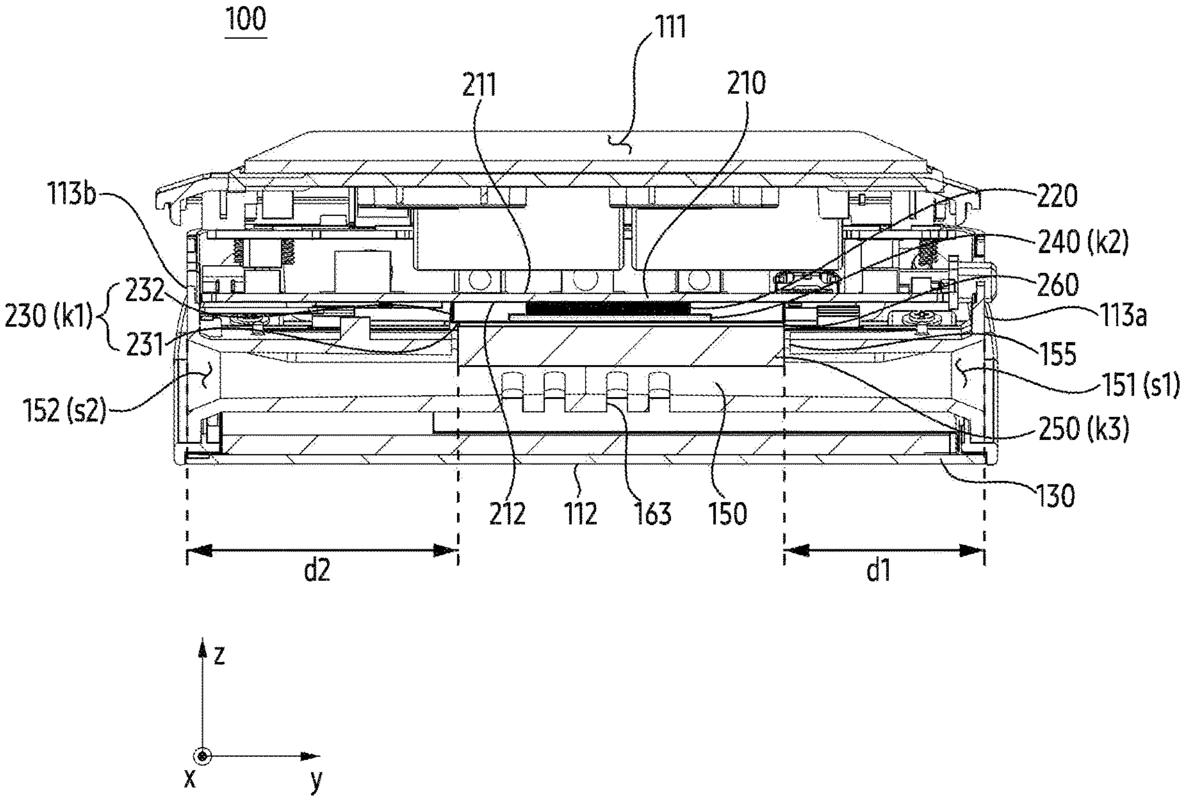
FIGS. 3A and 3B are cross-sectional views of an example electronic device taken along B-B' of FIG. 1C.
Figure 3B:
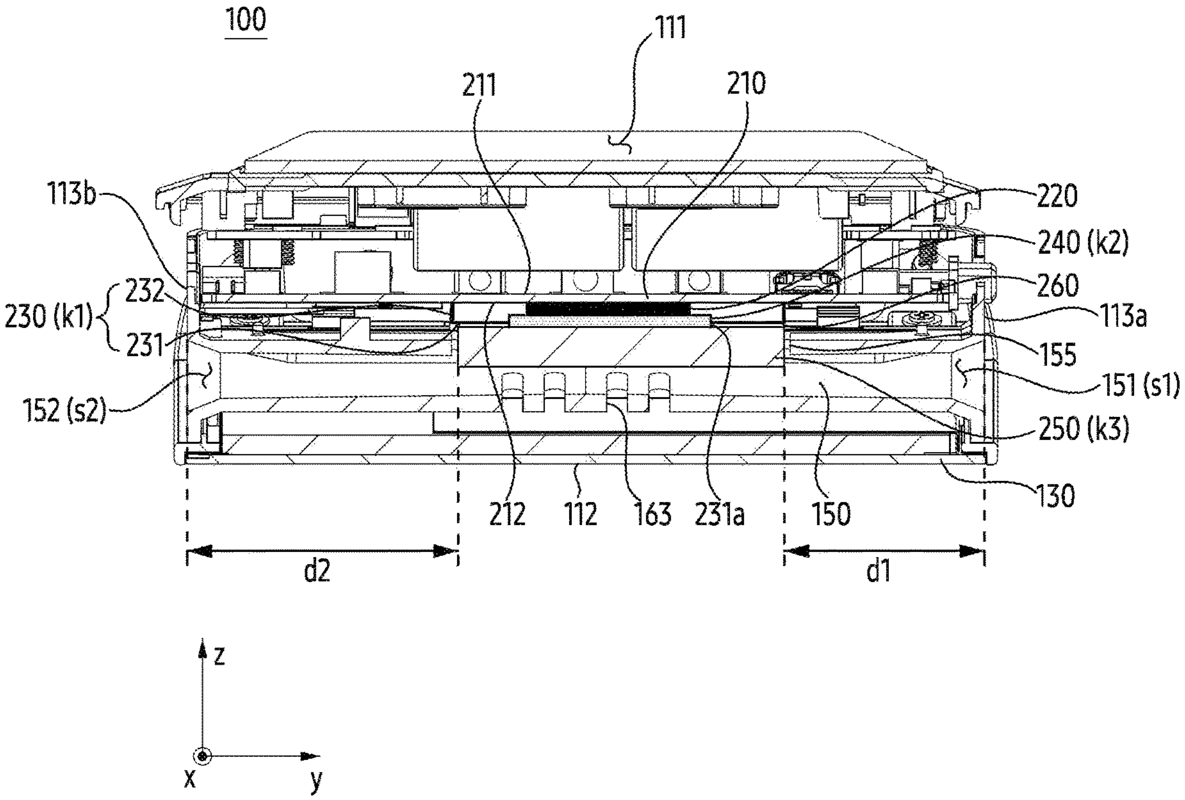

FIGS. 3A and 3B are cross-sectional views of an example electronic device taken along line B-B' of FIG. 1C.

Referring to FIGS. 3A and 3B, the electronic device 100 may include a housing 110, a camera 120, a display 130, a duct 150, a slit 155, a printed circuit board 210, a central processing unit 220, and a heat sink 250. The duct 150 may include a first opening 151 formed in a first side surface 113*a* of the housing 110 and a second opening 152 formed in a second side surface 113*b* opposite to the first side surface 113*a*.

According to an embodiment, a distance d1 from the first opening 151 to the heat sink 250 and a distance d2 from the second opening 152 to the heat sink 250 may be in a range of 5 cm to 10 cm, respectively. Since the distance d1 and the distance d2 are in the range of 5 cm to 10 cm, respectively, the electronic device 100 may reduce contacting of any body part (e.g., a finger) of the user with the heat sink 250 exposed into the duct 150 through the first opening 151 and/or the second opening 152, and thus reduce the user's body part from being injured by heat emitted from the heat sink 250.

According to an embodiment, the distance d1 from the first opening 151 to the heat sink 250 may be substantially the same as the distance d2 from the second opening 152 to the heat sink 250. For example, the heat sink 250 may be located substantially in the middle of the first side surface 113*a* and the second side surface 113*b*. For example, each of the size s1 of the first opening 151 and the size s2 of the second opening 152 may be in a range of 1 $mm^2$ to 81 $mm^2$. The heat sink 250 may be located substantially in the middle of the first opening 151 and the second opening 152. Since the size s1 and the size s2 are in the range of 1 $mm^2$ to 81 $mm^2$, respectively, and the distance d1 and the distance d2 are the same as each other, the electronic device 100 may reduce a part of the user's body from being inserted into the duct 150, thus protecting the user's body part from being possibly injured by the heat emitted from the heat sink 250.

According to an embodiment, the duct 150 may be formed on the inner surface of the duct 150 and may further include a third vent hole 163 facing away from the slit 155 to transfer heat emitted from the display 130 to the duct 150. For example, the third vent hole 163 may face the heat sink 250 protruding from the inner surface of the duct 150 through the slit 155. For example, the third vent hole 163 may be disposed between the display 130 and the heat sink 250. The third vent hole 163 may be disposed on a component (e.g., a flexible printed circuit board) electrically connected to the display 130. The heat emitted from the display 130 and/or the component electrically connected to the display 130 may be transferred to air inside the duct 150 through the third vent hole 163. Since the third vent hole 163 is formed on the inner surface of the duct 150 facing away from the slit 155, the electronic device 100 may protect or reduce the user's body part from being injured by the heat emitted through the third vent hole 163.

Referring to FIG. 3A, the electronic device 100 may include the shield can 230 surrounding the central processing unit 220, and the heat dissipation member 240 in contact with the central processing unit 220 and the shield can 230 in the shield can 230. In order to transfer heat emitted from the central processing unit 220 through the shield can 230 to the heat dissipation plate 250, the thermal conductivity k1 of the shield can 230 may be greater than the thermal conductivity k2 of the heat dissipation member 240 and may be less than the thermal conductivity k3 of the heat dissipation plate 250.

Referring to FIG. 3B, the electronic device 100 may further include the shield can 230 surrounding the central processing unit 220, and the heat dissipation member 240 facing the heat dissipation plate 250 and in contact with the third surface 221 facing the duct 150 of the central processing unit 220 and. In contrast to FIG. 3A, the shield can 230 may include a base 231 disposed between the central processing unit 220 and the heat sink 250, a through hole 231*a* formed in the base 231 toward the heat sink 250, and a sidewall 232 disposed along a periphery of the base 231. The heat dissipation member 240 may protrude from the base 231 toward the heat dissipation plate 250, passing through the through hole 231*a* of the shield can 230.

For example, the base 231 may be a portion of the shield can 230 facing the heat sink 250. For example, the base 231 may be a portion of the shield can 230 in contact with the heat sink 250. For example, the base 231 may face away from a fourth surface 212 of the printed circuit board 210. For example, the sidewall 232 may be a portion of the shield can 230 that is in contact with the fourth surface 212 of the printed circuit board 210. For example, the sidewall 232 may support the shield can 230 using the printed circuit board 210.

For example, the through hole 231*a* formed in the base 231 may overlap the central processing unit 220 when viewed from above with respect to the z-axis. The heat dissipation member 240 may be in contact with the heat dissipation plate 250 through the through hole 231*a*. Since the heat dissipation member 240 is in contact with the central processing unit 220 and the heat radiating plate 250, the heat dissipation member 240 may be configured to directly transfer the heat generated from the central processing unit 220 to the heat radiating plate 250 by means of the conductive heat transfer. According to an embodiment, the heat dissipation member 240 may fill up the through hole 231*a* of the shield can 230. By filling the through hole 231*a*, the heat dissipation member 240 may seal the inner space of the shield can 230 surrounding the central processing unit 220. By covering the inner space of the shield can 230, the sidewall 232 of the shield can 230 may reduce diffusion of the heat generated from the central processing unit 220 around the shield can 230.

According to an embodiment, the electronic device 100 may further include an adhesive member 260 disposed between the base 231 of the shield can 230 and the heat sink 250. For example, since the heat dissipation member 240 passes through the through hole 231*a* of the shield can 230 to come into contact with the heat dissipation plate 250, the adhesive member 260 may be in contact with a portion of the heat dissipation member 240 exposed to the outside of the shield can 230 through the through hole 231*a*. The adhesive member 260 may surround the portion of the heat dissipation member 240. As the adhesive member 260 is disposed between the base 231 of the shield can 230 and the heat sink 250, the adhesive member 260 may be configured to fix the heat dissipation member 240 and the heat sink 250 onto the base 231 of the shield can 230.

According to an embodiment, the thermal conductivity k2 of the heat dissipation member 240 may be greater than the thermal conductivity k1 of the shield can 230 and less than the thermal conductivity k3 of the heat dissipation plate 250. In contrast to FIG. 3A, the thermal conductivity k1 of the shield can 230 is less than the thermal conductivity k2 of the heat dissipation member 240, and therefore, the heat transferred from the central processing unit 220 to the shield can 230 may be reduced. Reducing the heat transferred to the shield can 230 makes it possible to reduce damage to components around the shield can 230 due to the heat of the shield can 230. Since the thermal conductivity k2 of the heat dissipation member 240 is less than the thermal conductivity k3 of the heat dissipation plate 250, the heat generated from the central processing unit 220 may be transferred to the heat dissipation plate 250 through the conductive heat transfer.

The electronic device 100 according to the above-described embodiment may include the heat sink 250 and the third vent hole 163 that are spaced apart from the first opening 151 and the second opening 152 by a specified distance on the inner surface of the duct 150, thereby protecting or alleviating any part of the user's body from being injured due to the heat emitted from the inner space of the housing 110 into the duct 150. According to an embodiment, the electronic device 100 may include the shield can 230 configured to pass through the heat dissipation member 240 in contact with the central processing unit 220, so as to transfer the heat generated from the central processing unit 220 through the heat dissipation member 240 to the heat dissipation plate 250.

Figure 4A:
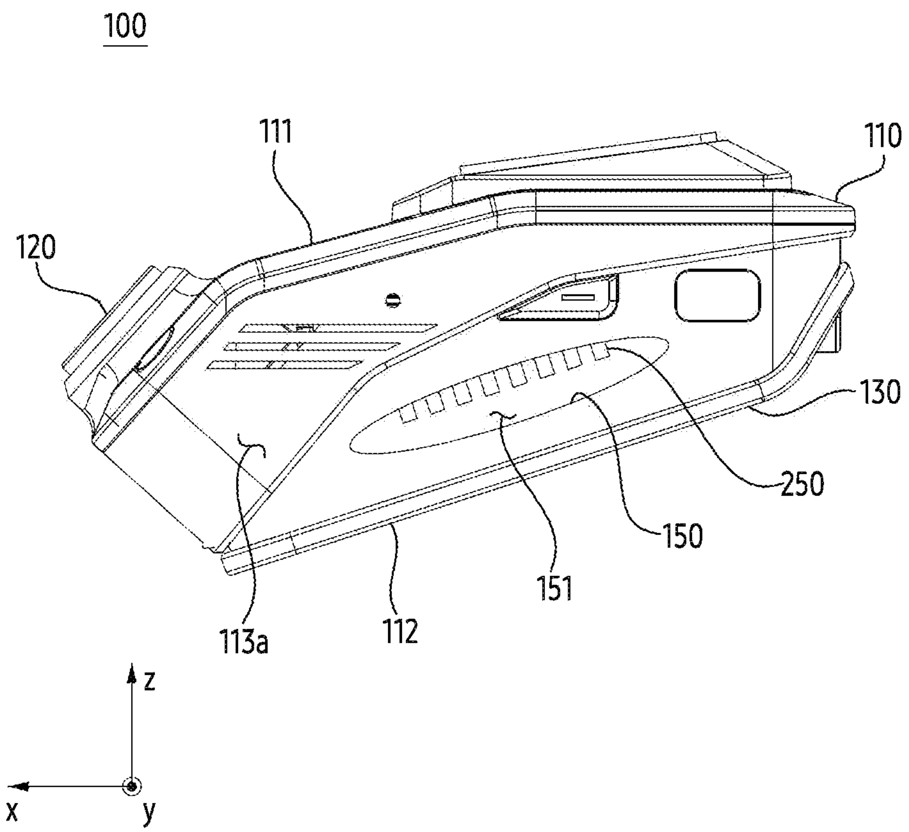
FIGS. 4A, 4B, and 4C are side views of an example electronic device.
Figure 4B:
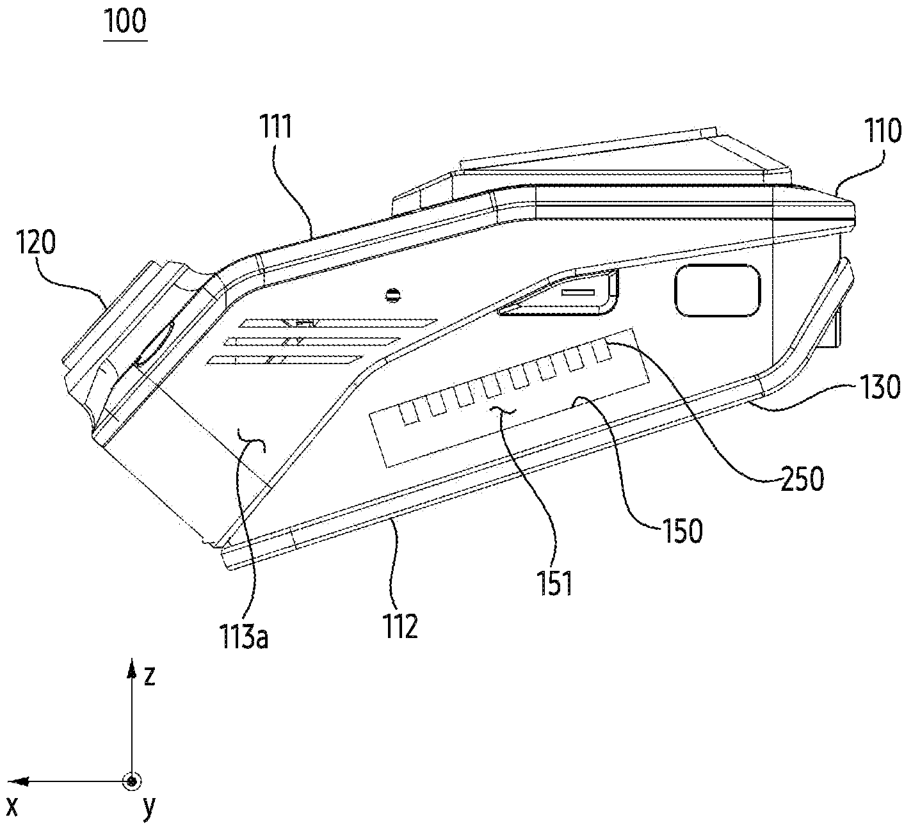
Figure 4C:
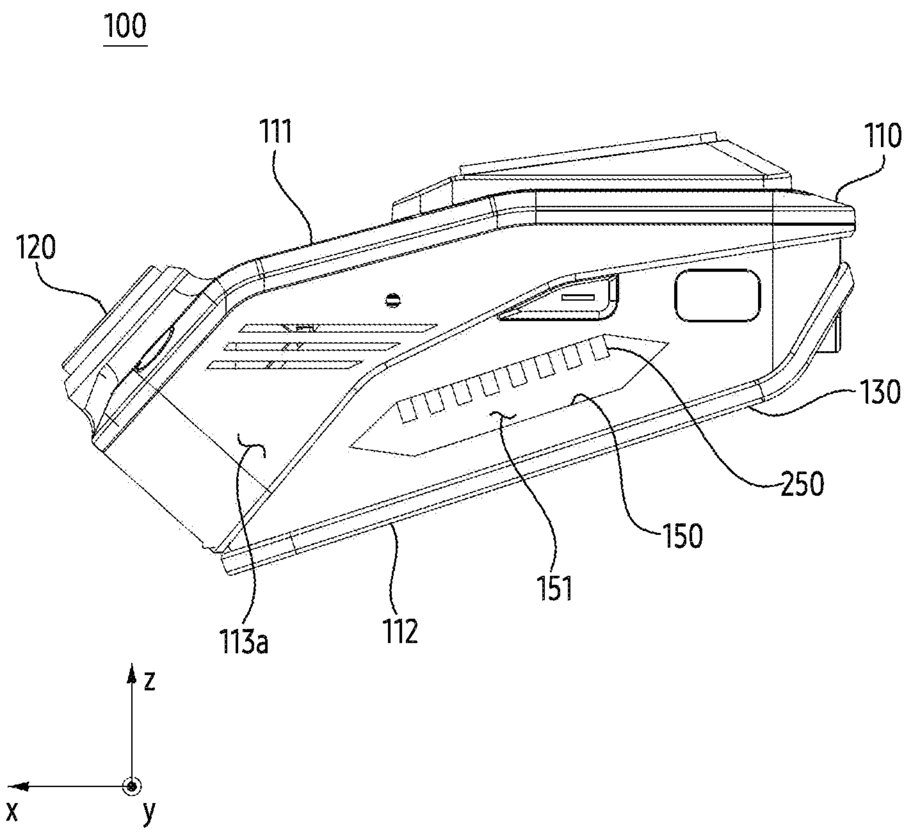

FIGS. 4A, 4B, and 4C are side views of an example electronic device.

Referring to FIGS. 4A, 4B, and 4C, the electronic device 100 may include a housing 110, a camera 120, a display 130, and a duct 150. The duct 150 may include a first opening 151 formed in a first side surface 113*a* of the housing 110 and a second opening (e.g., the second opening 152 of FIG. 1B) formed in a second side surface (e.g., the second side surface 113*b* of FIG. 1B) opposite to the first side surface 113*a*.

Referring to FIGS. 4A, 4B, and 4C, a cross-section of the duct 150 taken with respect to the x-z plane may have a certain shape. The shape may vary.

For example, referring to FIG. 4A, the cross-section of the duct 150 may have a circular or elliptical shape. For example, referring to FIG. 4B, the cross-section of the duct 150 may have a rectangular shape. For example, referring to FIG. 4C, the cross-section of the duct 150 may have a polygonal shape. However, the disclosure is not limited thereto.

The electronic device 100 according to the above-described embodiment may include a cross-section of the duct 150 having various shapes, thereby providing a user with various user experiences.

According to the above-described embodiment, an electronic device (e.g., the electronic device 100 of FIG. 1A) may comprise a housing (e.g., the housing 110 of FIG. 1A) including a front surface (e.g., the front surface 111 of FIG. 1A), a rear surface (e.g., the rear surface 112 of FIG. 1A) opposite to the front surface, and a plurality of side surfaces (e.g., a plurality of side surfaces 113 of FIG. 1A) disposed between the front surface and the rear surface. The electronic device may comprise a camera (e.g., the camera 120 of FIG. 1A) at least partially exposed through the front surface and a display (e.g., the display 130 of FIG. 1A) forming at least a portion of the rear surface. The electronic device may comprise a printed circuit board (e.g., the printed circuit board 210 of FIG. 2A) disposed in an inner space surrounded by the front surface, the rear surface, and the plurality of side surfaces of the housing and including a first surface (e.g., the first surface 211 of FIG. 2A) facing the front surface and a second surface (e.g., the second surface 212 of FIG. 2A) opposite to the first surface and facing the rear surface. The electronic device may comprise a central processing unit (e.g., the central processing unit 220 of FIG. 2A) disposed on the second surface of the printed circuit board. The electronic device may comprise a duct (e.g., the duct 150 of FIG. 1A) disposed between the second surface of the printed circuit board and the display and extending from a first side surface (e.g., the first side surface 113*a* of FIG. 1B) among the plurality of side surfaces, across the inner space of the housing, to a second side surface (e.g., the second side surface 113*b* of FIG. 1B) opposite to the first side surface. The electronic device may comprise a heat sink (e.g., the heat sink 250 of FIG. 2A) disposed on the central processing unit and at least partially protruding from an inner surface of the duct to transfer heat discharged from the central processing unit to the duct.

The electronic device according to an embodiment may comprise a slit (e.g., the slit 155 of FIG. 2A) formed, toward the central processing unit, on the inner surface of the duct and configured to pass through the heat sink. The electronic device may further comprise a shield can (e.g., the shield can 230 of FIG. 2A) surrounding the central processing device, and a heat dissipation member (e.g., the heat dissipation member 240 of FIG. 2A) in contact with one surface (e.g., the third surface 221 of FIG. 2B) facing the slit of the central processing device in the shield can.

The electronic device according to an embodiment may further comprise an adhesive member (e.g., the adhesive member 260 of FIG. 2A) disposed between the shield can and the heat sink.

According to an embodiment, a thermal conductivity (e.g., k1 of FIG. 2A) of the shield can may be greater than a thermal conductivity (e.g., k2 of FIG. 2A) of the heat dissipation member and less than a thermal conductivity (e.g., k3 of FIG. 2A) of the heat dissipation plate.

According to an embodiment, the duct may comprise a first opening (e.g., the first opening 151 of FIG. 1B) formed in the first side surface, and a second opening (e.g., the second opening 152 of FIG. 1B) formed in the second side surface, and a size (e.g., s1 of FIG. 1B) of the first opening and a size (e.g., s2 of FIG. 1B) of the second opening may be in a range of 1 $mm^2$ to 81 $mm^2$, respectively.

According to an embodiment, a distance (e.g., d1 of FIG. 3A) from the first opening to the heat sink and a distance (e.g., d2 of FIG. 3A) from the second opening to the heat sink may be in a range of 5 cm to 10 cm, respectively.

According to an embodiment, a distance from the first opening to the heat sink may be the same as a distance from the second opening to the heat sink.

According to an embodiment, the heat sink may comprise a first portion (e.g., the first portion 251 of FIG. 2B) having a planar shape at a position adjacent to the central processing unit, and a second portion (e.g., the second portion 252 of FIG. 2B) at least partially exposed from the first portion into the duct.

According to an embodiment, the second portion may comprise a plurality of protrusions (e.g., a plurality of protrusions 252*a* of FIG. 2B) and a plurality of grooves (e.g., a plurality of grooves 252*b* of FIG. 2B) respectively disposed between the plurality of protrusions.

According to an embodiment, an area (e.g., s3 of FIG. 2B) of the first portion facing the central processing unit may be greater than an area (e.g., s4 of FIG. 2B) of one surface of the central processing unit facing the duct.

According to an embodiment, the housing may further comprise a first vent hole (e.g., the first vent hole 161 of FIG. 1B) formed in the first side surface, and a second vent hole (e.g., the second vent hole 162 of FIG. 1B) formed in the second side surface opposite to the first side surface.

According to an embodiment, the duct may comprise a third vent hole (e.g., the third vent hole 163 of FIG. 3A) formed in the inner surface of the duct and configured to transfer heat emitted from the display to the duct.

According to an embodiment, the electronic device may further comprise a shield can including a base (e.g., the base 231 of FIG. 3B) disposed between the central processing unit and the heat sink, a through hole (e.g., the through hole 231*a* of FIG. 3B) formed on the base toward the heat sink, and a sidewall (e.g., the sidewall 232 of FIG. 3B) disposed along a periphery of the base, the shield can surrounding the central processing unit; and a heat dissipation member being in contact with one surface of the CPU facing the duct, and passing through the through hole of the shield to protrude from the base can toward the heat sink.

According to an embodiment, the electronic device may further comprise an adhesive member disposed between the base and the heat sink.

According to an embodiment, the thermal conductivity of the heat dissipation member may be greater than that of the shield can and less than that of the heat dissipation plate.

According to the above-described embodiment, an electronic device may comprise a housing including a front surface, a rear surface opposite to the front surface, and a plurality of side surfaces disposed between the front surface and the rear surface. The electronic device may comprise a camera at least partially exposed through the front surface, and a display forming at least a portion of the rear surface. The electronic device may comprise a printed circuit board disposed in an inner space surrounded by the front surface, the rear surface, and the plurality of side surfaces of the housing, the printed circuit board including a first surface facing the front surface and a second surface opposite to the first surface and facing the rear surface. The electronic device may comprise a central processing unit disposed on the second surface of the printed circuit board. The electronic device may comprise a duct disposed between the second surface of the printed circuit board and the display and extending from a first side surface among the plurality of side surfaces across the inner space of the housing to a second side surface opposite to the first side surface. The electronic device may comprise a slit disposed, toward the central processing unit, on an inner surface of the duct. The electronic device may comprise a heat sink disposed on the central processing unit and at least partially protruding from the inner surface of the duct through the slit, so as to transfer heat emitted from the central processing unit to the duct.

The electronic device according to an embodiment may further comprise a heat dissipation member contacting one surface of the central processing unit facing the slit in the shield can and an adhesive member disposed between the shield can and the heat sink.

According to an embodiment, the size of the first opening and the size of the second opening may be in a range of 1 $mm^2$ to 81 $mm^2$, respectively.

According to an embodiment, the distance from the first opening to the heat sink may be the same as the distance from the second opening to the heat sink.

According to an embodiment, the heat sink may comprise a first portion having a flat shape at a position adjacent to the central processing unit, and a second portion penetrating the slit from the first portion and at least partially exposed into the duct.

The electronic device according to various embodiments of the disclosure may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may be interchangeably used with other terms, for example, "logic", "logic block", "unit", "part", "portion", or "circuitry". A module may be a single integral component, or a minimum unit or part thereof, adapted to perform one or more functions. For example, according to an embodiment, the module may be implemented in a form of an application-specific integrated circuit (ASIC).

Various embodiments of the disclosure may be implemented as software (e.g., a program) including one or more instructions that are stored in a storage medium (e.g., an internal memory or an external memory) that is readable by a machine (e.g., the electronic device 100). For example, a processor (e.g., the central processing unit 220) of the machine (e.g., the electronic device 100) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

What is claimed is:

1. An electronic device comprising:
a housing including:
a front surface,
a rear surface opposite to the front surface, and
a plurality of side surfaces disposed between the front surface and the rear surface;
a camera at least partially exposed through the front surface;
a display forming at least a portion of the rear surface;
a printed circuit board (PCB) disposed in an internal space surrounded by the front surface, the rear surface, and the plurality of side surfaces of the housing, wherein the PCB includes:
a first surface facing the front surface, and
a second surface, opposite to the first surface, facing the rear surface;
a central processing unit (CPU) disposed on the second surface of the PCB;
a duct, disposed between the second surface of the PCB and the display, extending from a first side surface among the plurality of side surfaces, across the internal space of the housing, to a second side surface among the plurality of side surfaces opposite to the first side surface such that the duct is exposed out of the electronic device; and
a heat sink including:
a first portion coupled with the CPU and positioned within the housing, and
a second portion extending from the first portion and protruding through an inner surface of the duct,
wherein the heat sink is configured to transmit heat from the CPU to an airflow in the duct,
wherein the housing further includes:
a first vent hole formed through the first side surface, and
a second vent hole formed through the second side surface, and
wherein the duct includes a third vent hole for transmitting heat emitted from the display to the duct, and the third vent hole formed through the inner surface of the duct.

2. The electronic device of claim 1, further comprising:
a slit formed, toward the CPU, through the inner surface of the duct, and configured for the heat sink to pass through the slit;
a shield can surrounding the CPU; and
a heat dissipation member inside the shield can contacting one surface of the CPU facing the slit.

3. The electronic device of claim 2, further comprising:
an adhesive member disposed between the shield can and the heat sink.

4. The electronic device of claim 2,
wherein a thermal conductivity of the shield can is greater than a thermal conductivity of the heat dissipation member and is smaller than a thermal conductivity of the heat sink.

5. The electronic device of claim 1,
wherein the duct includes:
a first opening formed through the first side surface; and
a second opening formed through the second side surface, and
wherein each of a size of the first opening and a size of the second opening is in a range of 1 $mm^2$ to 81 $mm^2$.

6. The electronic device of claim 5,
wherein each of a distance from the first opening to the heat sink and a distance from the second opening to the heat sink is in a range of 5 cm to 10 cm.

7. The electronic device of claim 6,
wherein the distance from the first opening to the heat sink is equal to the distance from the second opening to the heat sink.

8. The electronic device of claim 1,
wherein the first portion of the heat sink has a planar shape at a position adjacent to the CPU.

9. The electronic device of claim 8,
wherein the second portion includes:
a plurality of protrusions; and
a plurality of grooves respectively disposed between the plurality of protrusions.

10. The electronic device of claim 8,
wherein an area of the first portion facing the CPU is greater than an area of one surface of the CPU facing the duct.

11. The electronic device of claim 1, further comprising:
a shield can surrounding the CPU, and including a base disposed between the CPU and the heat sink, a through hole formed through the base toward the heat sink, and
a sidewall disposed along a periphery of the base; and
a heat dissipation member contacting one surface of the CPU facing the duct, and protruding from the base passing through the through hole of the shield can toward the heat sink.

12. The electronic device of claim 11, further comprising:

an adhesive member disposed between the base and the heat sink.

13. The electronic device of claim 11, wherein a thermal conductivity of the heat dissipation member is greater than a thermal conductivity of the shield can and is smaller than a thermal conductivity of the heat sink.

14. An electronic device comprising:

a housing including:

a front surface, a rear surface opposite to the front surface, and a plurality of side surfaces disposed between the front surface and the rear surface;

a camera at least partially exposed through the front surface;

a display forming at least a portion of the rear surface;

a printed circuit board (PCB) disposed in an internal space surrounded by the front surface, the rear surface, and the plurality of side surfaces of the housing, wherein the PCB includes:

a first surface facing the front surface, and a second surface, opposite to the first surface, facing the rear surface;

a central processing unit (CPU) disposed on the second surface of the PCB;

a duct, disposed between the second surface of the PCB and the display, extending from a first opening formed through a first side surface among the plurality of side surfaces, across the internal space of the housing, to a second opening formed through a second side surface among the plurality of side surfaces opposite to the first side surface, wherein the duct is exposed out of the electronic device;

a slit disposed, toward the CPU, through an inner surface of the duct;

a heat sink disposed on the CPU for transmitting heat emitted from the CPU to the duct, the heat sink at least partially protruding through the inner surface of the duct and passing through the slit; and a shield can surrounding the CPU, wherein the housing further includes:

a first vent hole formed through the first side surface, and a second vent hole formed through the second side surface, and wherein the duct includes a third vent hole for transmitting heat emitted from the display to the duct, formed through the inner surface of the duct.

15. The electronic device of claim 14, further comprising:

a heat dissipation member inside the shield can contacting one surface of the CPU facing the slit; and an adhesive member disposed between the shield can and the heat sink.

16. The electronic device of claim 14, wherein each of a size of the first opening and a size of the second opening is in a range of 1 $mm^2$ to 81 $mm^2$.

17. The electronic device of claim 14, wherein a distance from the first opening to the heat sink is equal to a distance from the second opening to the heat sink.

18. The electronic device of claim 14, wherein the heat sink includes:

a first portion having a planar shape at a position adjacent to the CPU; and a second portion extending from the first portion toward an inside of the duct.

* * * * *